United States Patent [19]

Taylor et al.

[11] Patent Number: 5,399,918
[45] Date of Patent: Mar. 21, 1995

[54] LARGE FAN-IN, DYNAMIC, BICMOS LOGIC GATE

[75] Inventors: Gregory F. Taylor, Portland; Lawrence T. Clark, Beaverton, both of Oreg.

[73] Assignee: Intel Corporation, Santa Clara, Calif.

[21] Appl. No.: 129,664

[22] Filed: Sep. 30, 1993

[51] Int. Cl.⁶ .................. H03K 19/02; H03K 17/16
[52] U.S. Cl. ......................................... 326/110; 326/27
[58] Field of Search .................... 307/446, 570, 443

[56] References Cited

U.S. PATENT DOCUMENTS

| | | | |
|---|---|---|---|
| 4,866,304 | 9/1989 | Yu | 307/446 |
| 4,890,018 | 12/1989 | Fukushi | 307/446 |
| 5,300,829 | 4/1994 | Lev | 307/570 |

FOREIGN PATENT DOCUMENTS 4-43713 2/1992 Japan ................................ 307/473

Primary Examiner—Edward P. Westin
Assistant Examiner—Andrew Sanders
Attorney, Agent, or Firm—Blakely, Sokoloff, Taylor & Zafman

[57] ABSTRACT

A highly reliable, large fan-in, high speed, BiCMOS circuit. The amount of MOS transistor parasitic capacitance appearing on the output line of the circuit is reduced by adding only emitter capacitance of bipolar transistors to the output line for each input to the basic logic circuit. Circuitry is provided to raise the base voltage of a reverse biased bipolar transistors to reduce or eliminate the reverse bias.

24 Claims, 5 Drawing Sheets

LARGE FAN-IN, DYNAMIC, BICMOS LOGIC GATE

FIELD OF THE INVENTION

The present invention relates to the field of integrated logic circuits and more particularly to a BiCMOS circuit.

BACKGROUND OF THE INVENTION

While conventional CMOS (Complementary Metal Oxide Semiconductor) integrated circuit processes may be used to create circuits which consume less power and occupy less space on a semiconductor substrate than similar circuits designed around a bipolar transistor fabrication process, bipolar devices, among other advantages, have the inherent ability to operate at higher speeds, drive larger capacitive loads, and switch faster than their MOS (Metal Oxide Semiconductor) counterparts. In an attempt to capture the advantages of both bipolar and MOS devices in one circuit, a BiCMOS (Bipolar Complementary Metal Oxide Semiconductor) process has been developed.

In a BiCMOS process, bipolar and MOS transistors are both created on a single semiconductor substrate so that a portion of the resulting circuit operates using bipolar transistors while another portion of the same circuit operates using MOS transistors. As a result, one is given the freedom to design and implement a BiCMOS circuit which, among other advantages, consumes very lit fie power, occupies very little space, operates at very high speeds, and can drive large capacitive loads. A circuit such as this would have extensive applications in, for instance, battery-powered notebook computers where power consumption must be minimized in order to prolong battery life, size must be minimized to enhance portability, and processing speeds must be fast enough to handle advanced computational applications.

A logic gate is a circuit which executes a logical function on the logical values applied to the gate's input or inputs to produce an output and may exist within a main processing unit of a computer system or any of its peripherals. A logic gate may be configured to execute, for instance, NAND, NOR, AND, OR, XOR, inverter, etc. functions. Input data is gathered from, for instance, a cache or other buffer memory location, RAM, ROM, a latch or any register by processing circuitry which may contain the logic circuitry itself. After the data is transported to the logic gate, the logical function is applied to the input data in order to generate an output.

For demonstration purposes below, we will assume that a low voltage is that voltage which corresponds most closely with one particular logical state while a high voltage is that voltage which corresponds most closely with the opposite logical state. For example, in a 5 volt CMOS system, a voltage greater than approximately 2.5 V may be considered a logical "1", and a voltage less than approximately 2.5 V may be considered a logical "0". Of course, this correspondence may be reversed such that a low voltage represents a logical "1" and a high voltage represents a logical "0". In an alternate system which operates with a 3V supply, for example, a voltage greater than approximately 1.5 V may be considered a logical "1, and a voltage less than approximately 1.5 V may be considered a logical "0". Of course, this correspondence may again be reversed. In general, the lower voltage plus one-half the difference between the upper voltage minus the lower voltage of any system may be considered the approximate boundary between high and low voltages or alternate logical states for demonstration purposes herein.

In the circuit of FIG. 1, the gates of p-channel transistors 10 and 11 are coupled to inputs A and B respectively. The gates of n-channel transistors 13 and 16 are also coupled to input A while the gates of n-channel transistors 12 and 15 are coupled to input B. Transistors 10 and 11 are coupled to the supply voltage Vdd at one end and the base of npn bipolar transistor 14 at the other through base line 17. The collector of transistor 14 is coupled to the supply voltage Vdd while its emitter is coupled to the output of the circuit. The output of the circuit is isolated from Vss (usually a low voltage such as ground or 0 V) by transistors 15 and 16 in series, while the base of transistor 14 is isolated from Vss by transistors 12 and 13 in series.

FIG. 1 illustrates a circuit diagram for a prior an NAND gate logic circuit. This particular NAND gate accepts two inputs, A and B and generates, at its output, the result of the logical function A NAND B. Each input controls the operation of three transistors. Transistors 10 and 11 are p-channel transistors, so in order for the supply voltage Vdd to be applied to the base of transistor 14, thereby pulling the output high, either of inputs A or B must be at a low voltage. On the other hand, if both of the inputs A and B are at a high voltage, supply voltage Vdd will not be able to reach the base of transistor 14 through either of transistors 10 or 11, and all n-channel transistors 12, 13, 15, and 16 will be on thereby pulling the base of transistor 14 low (turning it off) and the output node low.

There are several problems with this type of a logic circuit. For example, note that the base of transistor 14 is coupled to the large MOS transistors 10, 11 and 12 through base line 17. In this type of configuration, the capacitive load on the base line 17 is greatly increased by the presence of parasitic capacitance within the large MOS transistors 10, 11 and 12. The more capacitance which appears on base line 17, the slower the device switching speed of pulling the base of transistor 14 high, which slows the ultimate switching speed of the entire circuit of FIG. 1 for pulling the output high. In fact, too much capacitance on base line 17 will make the circuit too slow to be practical. The larger the MOS transistors on base line 17, the more capacitance that the MOS transistor will contribute to base line 17. Likewise, the more MOS transistors appearing on base line 17, the greater the contribution to the capacitance on base line 17.

Another problem with the logic circuit of FIG. 1 is that the output node is pulled down by transistors 15 and 16 in series, and the base line 17, coupled to the base node of transistor 14, is pulled down by transistors 12 and 13 in series. It can take a long time for a series connection of MOS transistors to charge or discharge a node. The more MOS transistors appearing in series between the node to be pulled down (discharged) and Vss, the slower the device switching speed of pulling down that node. Likewise, the more MOS transistors appearing in series between the node to be pulled up (charged) and Vdd, the slower the device switching speed of pulling up that node.

If one were to expand the circuit of FIG. 1 from a two input NAND gate to, for instance, a four input NAND gate, two additional p-channel transistors would appear in parallel with transistors 10 and 11 between Vdd and base line 17, two additional n-channel transistors would appear in series with transistors 12 and 13 between base line 17 and Vss, and two additional n-channel transistors would appear in series with transistors 15 and 16 between the output node and Vss. Therefore, as the circuit of FIG. 1 expands to accept more inputs, the number of MOS transistors appearing in parallel on base line 17 increases proportionately. As discussed above, these additional large MOS transistors add capacitive loads to the base line, slowing down the circuit's switching speed. Also, the number of MOS transistors appearing in series to pull down base line 17 and the output node increases proportionately with additional inputs thereby also slowing down the circuit's switching speed. There comes a point where too many inputs incorporated into the circuit of FIG. 1 will make the device too slow to be practical. This is known as the fan-in limit and is typically about four inputs for a circuit like the one depicted in FIG. 1.

In the circuit of FIG. 2, the emitter of npn bipolar transistor 31 is coupled to the supply voltage Vdd while its base is receptive of input voltage A and its collector is coupled to output line 34. Note that in practice, bipolar transistors are generally not employed as input buffers to a circuit, as in FIG. 2, because the input resistance of a bipolar transistor is much lower than that of an MOS transistor. This is done here to better demonstrate a particular deficiency in the prior art. High input resistance is usually a desirable quality of a circuit. Transistors 30, 32, and 33 are n-channel MOS transistors. The gates of transistors 32 and 33 are coupled to input nodes B and C respectively. The drains of transistors 32 and 33 are coupled to Vdd while the sources of transistors 32 and 33 are coupled to the output line 34. The gate of precharge transistor 30 is coupled to the precharge node PRCH while its drain is coupled to the output line 34 and its source is coupled to Vss.

Consider the operation of the dynamic circuit of FIG. 2. To clarify why this circuit is classified as a dynamic circuit we must analyze its operation over time. First, a circuit such as this must be reset or precharged. To do this, a low voltage is applied to the control terminals A, B, and C of transistors 31, 32, and 33 respectively. A high voltage is applied to the gate of transistor 30 at the PRCH node. In doing so, the output line 34 is drained of charge until it reaches a low voltage approximately equal to Vss. Then transistor 30 is turned off by applying a low voltage to the PRCH gate terminal of transistor 30. At this point, the circuit is ready to be triggered.

The circuit executes a logical OR function whereby when the voltage at any of the terminals A, B, or C of transistors 31, 32, or 33, respectively, switches to a high voltage, the output line 34 will also switch to a high voltage. In other words, any change in the logical state of terminals A, B, or C of transistors 31, 32, or 33, respectively, will cause the output line 34 to switch logical states. For instance, assume the base terminal A of transistor 31 goes high. This will turn on the bipolar transistor 31 thereby pulling the output line 34 high. The bipolar transistor 31 will then drive the output line 34 and cause it to remain high until the circuit is again reset as described above.

The circuit of FIG. 2 suffers from several problems. For example, one problem relates to MOS capacitance loading on its output line 34 in a similar manner in which the circuit of FIG. 1 suffers from MOS capacitance loading on its base line 17. The capacitance from large MOS transistors 30, 32 and 33 will load the output line with capacitance thereby significantly slowing the speed of this circuit. Note that additional inputs to the circuit of FIG. 2 would require that additional MOS transistors be attached in parallel between the supply voltage Vdd and the output line 34. Therefore, each additional input to the circuit of FIG. 2 will add a proportionate amount of MOS capacitance to the output line 34, slowing the switching speed of the circuit until the circuit becomes too slow to be practical.

Now let us assume the circuit of FIG. 2 is reset, and this time, node B on the gate of MOS transistor 32 goes high thereby pulling the output line 34 high. The MOS transistor 32 will now drive the output line 34 until the circuit is again reset as described above. In this case, bipolar transistor 31 will have a low base voltage at base node A and a high emitter voltage attached to the output line 34. This condition is known as negative or reverse bias across the pn base-emitter junction of bipolar transistor 31. Such a condition is a reliability problem. Reverse biasing a base-emitter junction causes hot electron injection in the transistor. This can result in the creation of base-emitter leakage current and a drop in transistor gain which is a function of the base-emitter reverse bias stress voltage and stress time. This leakage current and drop in transistor gain degrades the performance of the bipolar transistor thereby degrading the performance of the entire circuit. Thus, the reliability of the microprocessor in which the circuit operates, and indeed the reliability of the entire computer system in which such a microprocessor resides, is jeopardized by such reverse biasing of the base-emitter junction of the bipolar transistor.

Transistors 30 and 33 will not experience such reliability problems because they are MOS transistors. However, any npn bipolar transistor whose emitter is coupled to the output line 34, such as transistor 31, will suffer the reverse bias base-emitter junction reliability concern discussed above. On the other hand, any large MOS transistor coupled to the output line 34, such as transistors 30, 32, and 33, while not experiencing such reliability problems, will load the output line 34 with capacitance thereby slowing the speed of the circuit.

Therefore, to increase device speed it is desirable to use bipolar transistors to drive circuit output lines since bipolar transistors can deliver much more current to the output line per unit of capacitive load than can MOS transistors. The more current delivered to the output of a circuit, the better able that circuit is of driving large capacitive loads. It is impractical to drive large capacitive loads quickly with MOS transistors because they themselves contribute too much capacitance to an output line without providing much current in return. But if bipolar transistors are used on a circuit output line, some type of method must be employed to protect the bipolar transistors on the output line from either receiving too much reverse bias base-emitter voltage stress or reducing the amount of time a reverse bias base-emitter voltage is present.

SUMMARY OF THE PRESENT INVENTION

A highly reliable, large fan-in, high speed, BiCMOS circuit is described. In order to improve the speed and fan-in capability of a logic circuit, the capacitive load on the output line of the circuit is reduced while the reliability and current driving capability of the output line is vastly improved. This is achieved by reducing the amount of MOS transistor parasitic capacitance appearing on the output line. Each input to the basic logic circuit contributes only the capacitance of one emitter to the output line of the circuit. This provides for a high fan-in capability of the circuit along with improved speed and the ability to drive large capacitive loads. The reverse bias base-emitter voltage stress is reduced by providing circuitry to raise the base voltage of reverse biased bipolar transistors in order to improve the reliability of the circuit. Precharging the dynamic circuit version of this logic gate is done by bleeding the charge off the bases of the output bipolar transistors and the output line. The bases of the bipolar transistors are not discharged through the output line as this would short the bases to the emitters of these bipolar transistors thereby potentially causing a high power drain and would require long times to reset.

DETAILED DESCRIPTION OF THE PRESENT INVENTION

A highly reliable, large fan-in, BiCMOS circuit is described which is capable of operating at high speeds and driving large capacitive loads. In the following description, numerous specific details such as device types, voltage levels, circuit configurations, etc., are set forth in order to provide a more thorough understanding of the present invention. It will be obvious, however, to one skilled in the art, that the present invention may be practiced without employing these specific details. In other instances, well-known circuit design techniques and operation have not been described in detail in order not to unnecessarily obscure the present invention.

Figure 3:
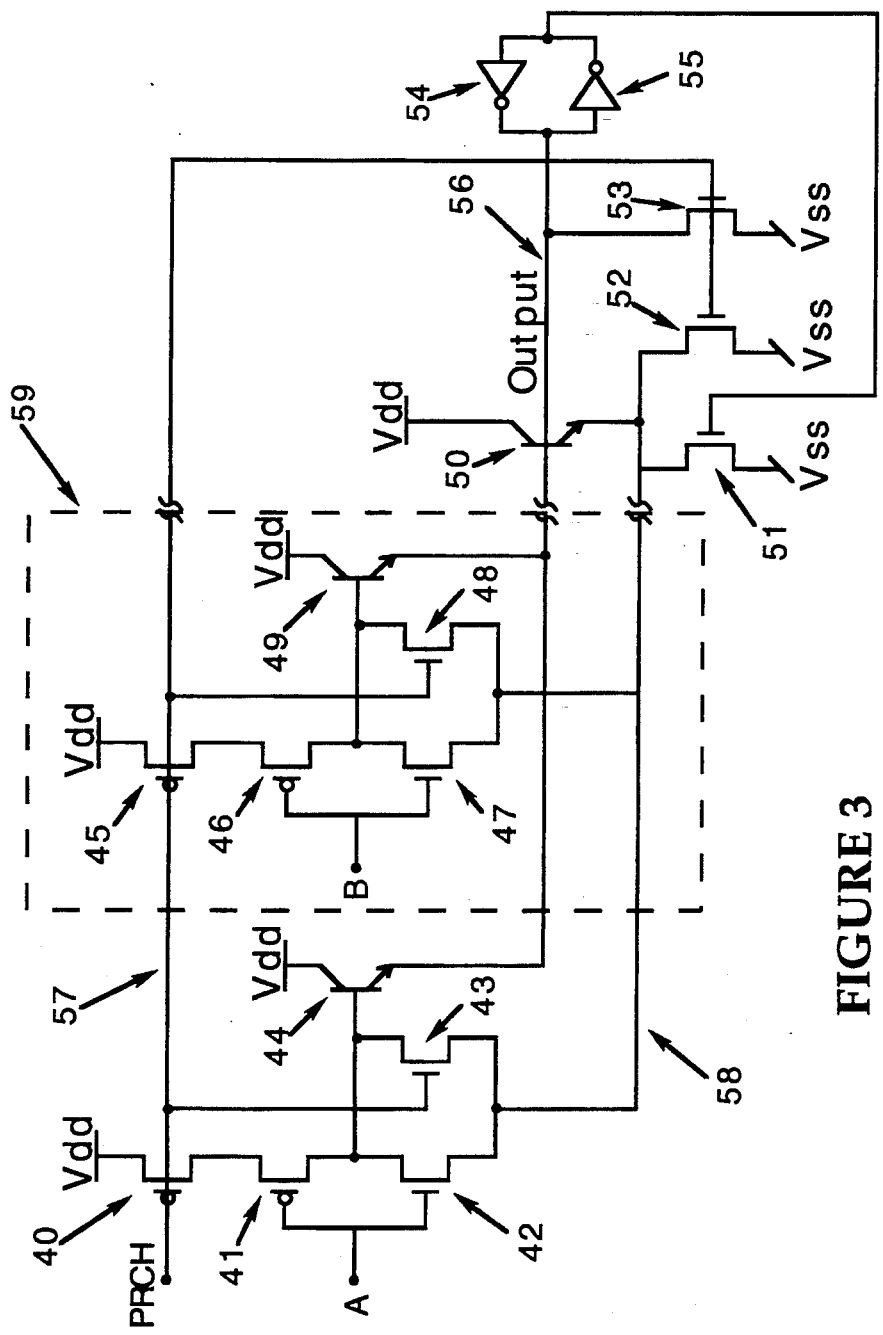
FIG. 3 shows a first embodiment of a dynamic BiCMOS NAND gate consistent with the present invention.
Figure 4:
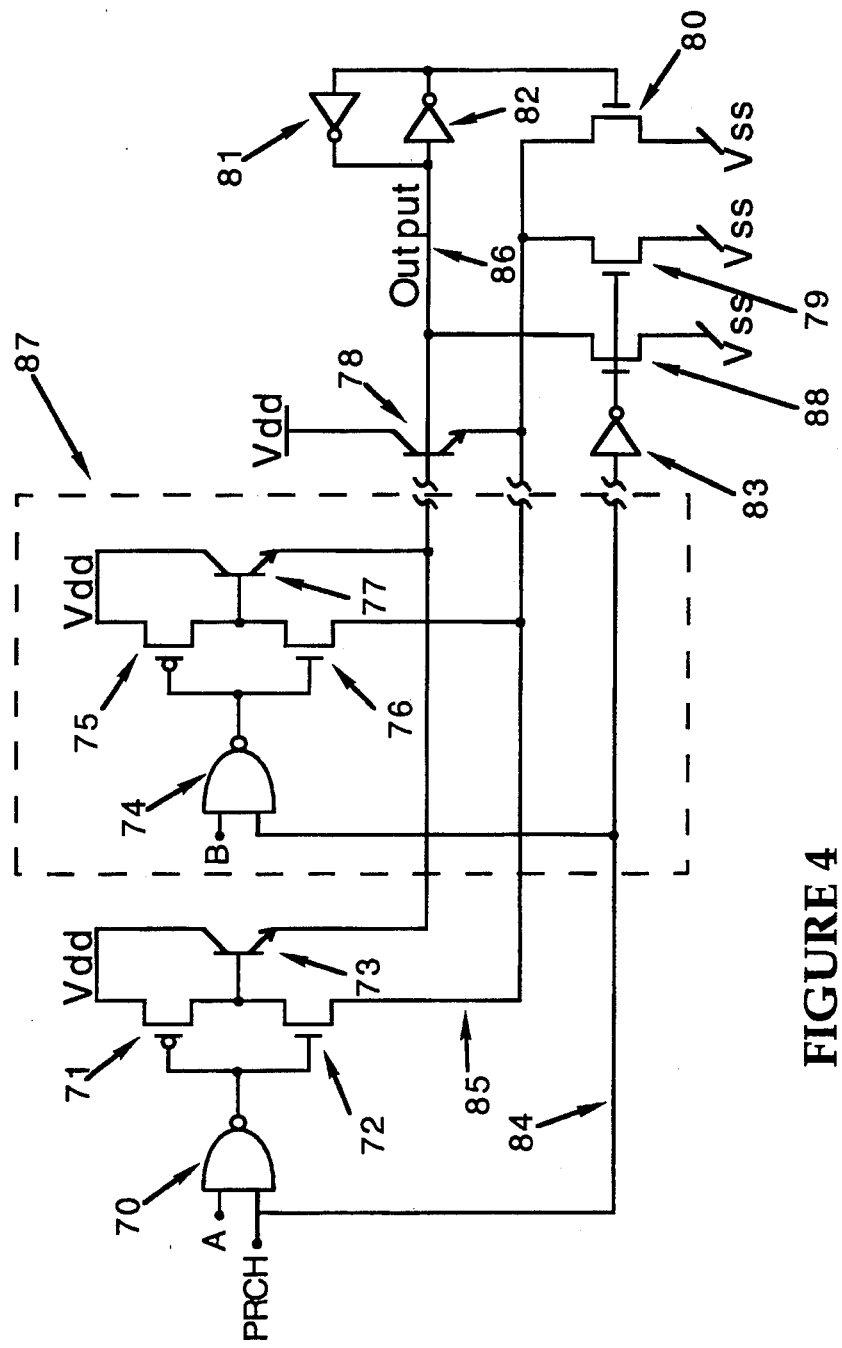
FIG. 4 shows a second embodiment consistent with the present invention.
Figure 5:
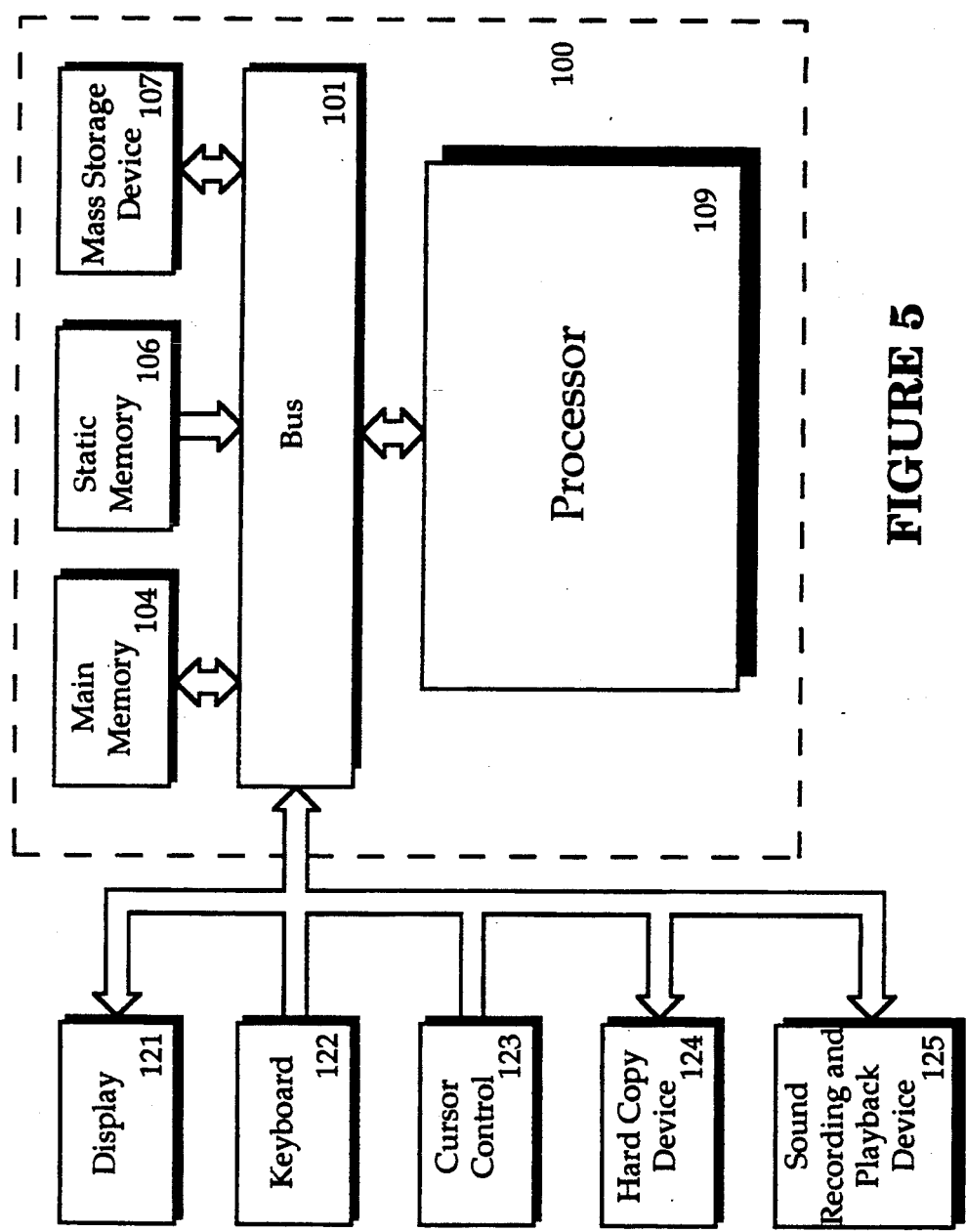
FIG. 5 shows an implementation of an embodiment of the present invention in a computer system.

While diagrams representing currently preferred embodiments of the present invention are illustrated in FIGS. 3, 4, and 5, these illustration are not intended to limit the invention. The specific circuits described herein are only meant to help clarify one's understanding of the present invention and to illustrate currently preferred embodiments of how the present invention may be implemented in order to form a currently preferred device. It will be appreciated by one skilled in the art that the broader spirit and scope of the present invention, as set forth in the appended claims, can be applied to any type of circuit which seeks to improve speed performance and reliability.

FIG. 3 shows a currently preferred embodiment of the present invention implemented as a BiCMOS dynamic NAND gate. In a currently preferred embodiment, transistors 40, 41, 45, and 46 are p-channel MOS transistors. Transistors 44, 49, and 50 are npn bipolar transistors, and the rest are n-channel MOS transistors. The gates of transistors 40, 43, 45, 48, 52, and 53 are coupled to the PRCH node through line 57 used to precharge the dynamic circuit. The gates of transistors 41 and 42 are coupled to input node A in the same manner that the gates of transistors 46 and 47 are coupled to input node B. The base of bipolar transistor 44 is coupled to the output of the inverter subcircuit comprised of transistors 41 and 42 of node A in the same manner that the base of bipolar transistor 49 is coupled to the output of the inverter subcircuit comprised of transistors 46 and 47 of node B. The base of bipolar transistor 44 is also coupled to the drain of transistor 43 in the same manner that the base of bipolar transistor 49 is coupled to the drain of transistor 48 while the sources of transistors 43 and 48 are coupled to the drain/feedback line 58.

Supply voltage Vdd is separated from the base node of bipolar transistors 44 and 49 by a series connection of transistors 40 and 41 and a series connection of transistors 45 and 46 respectively. The drains of transistors 42 and 47 are coupled to the bases of transistors 44 and 49 respectively while the sources of transistors 42 and 47 are coupled to the drain/feedback line 58. The collectors of transistors 44 and 49 are coupled to Vdd and the emitters of these transistors are coupled to the output line 56 which is in turn coupled to the base of transistor 50. The collector of transistor 50 is coupled to Vdd and its emitter is coupled to the drain/feedback line 58. The drain/feedback line 58 is separated from Vss by weak transistor 51 and transistor 52 in parallel. Transistor 53 separates the output line 56 from Vss.

Note that the subcircuit block 59 acts on input node B in the same manner in which an identical subcircuit block acts on input node A. In fact, any number of such subcircuit blocks identical to subcircuit block 59 may be connected in parallel in such a manner to precharge line 57, output line 56 and drain/feedback line 58. Because only a single bipolar transistor is coupled to the output line 56 for each additional subcircuit block input to the dynamic NAND gate, this circuit is capable of supporting large fan-in applications. Also, additional inputs do not add any additional series MOS transistors to the circuit of FIG. 3. Only a single transistor, 41 for input A and 46 for input B, need be switched to pull the base of the corresponding bipolar transistor high, so the switching speed of this circuit is not significantly hindered by additional inputs.

In fact, this circuit has demonstrated high fan-in capacities in range of approximately 25 to 35 input nodes. For demonstrative purposes, however, we will assume that the dynamic NAND gate of FIG. 3 is merely a two input NAND gate. It should be realized, though, that the operation of each transistor within each additional subcircuit block identical to subcircuit block 59 will operate substantially the same as the respective transistor depicted in FIG. 3 and described below. In alternate embodiments of the present invention, the subcircuit blocks and, perhaps, general layout of the circuit in FIG. 3 may be adjusted to implement another form of a NAND gate. In still alternate embodiments of the present invention, other logic functions may be implemented thereby also changing the specific circuit layout from the one depicted in FIG. 3.

Opposing inverters 54 and 55 are composed of small dimension MOS transistors configured to invert the signal present at their inputs. Inverter 54 has the gate of transistor 51 coupled to its input and output line 56 coupled to its output. Inverter 55, on the other hand, has output line 56 coupled to its input while the gate of transistor 51 is coupled to its output. If output line 56 is low, inverter 55, whose input is output line 56, will drive the gate of small dimension MOS transistor 51 high. At the same time, inverter 54, whose input is the gate of small dimension transistor 51, will pull the output line 56 low. In this manner, the inverters 54 and 55 work together to reinforce the voltage present on output line 56 and to control the operation of transistor 51.

In a currently preferred embodiment of the present invention, the dynamic circuit of FIG. 3 is first precharged to prepare it for triggering a response to switches in logical states of the input nodes. The voltage present at the PRCH node goes high which will raise the voltage of precharge line 57. Since transistors 40 and 45 are p-channel transistors, they will be turned off thereby disengaging the Vdd power supply from the inverter subcircuits of input nodes A and B respectively. Transistors 43 and 48 will be turned on to allow any charge present at the base of bipolar transistors 44 and 49, respectively, to be drained. The draining of charge from the bases of bipolar transistors 44 and 49 will be described in more detail below. Transistors 52 and 53 will be turned on to allow any charge present on drain/feedback line 58 and output line 56, respectively, to be drained.

In a preferred embodiment of the present invention, once draining of charge from the dynamic circuit of FIG. 3 has been completed by raising the voltage on the precharge line 57 as described above, the voltage at input nodes A and B goes high and the PRCH node is grounded. The circuit is now ready to be triggered to execute a NAND function responsive to the input voltages at nodes A and B. When the precharge line 57 is grounded, transistors 40 and 45 turn on to allow the voltage Vdd to supply the inverter subcircuits coupled to input nodes A and B. At this point, the voltage at the base of bipolar transistors 44 and 49 is low since the inputs A and B are high which opens pull-down transistors 42 and 47 while closing pull-up transistors 41 and 46 respectively. Precharging transistors 43 and 48, which are used during circuit reset to drain the base of bipolar transistors 44 and 49, respectively, are now off.

Figure 2:
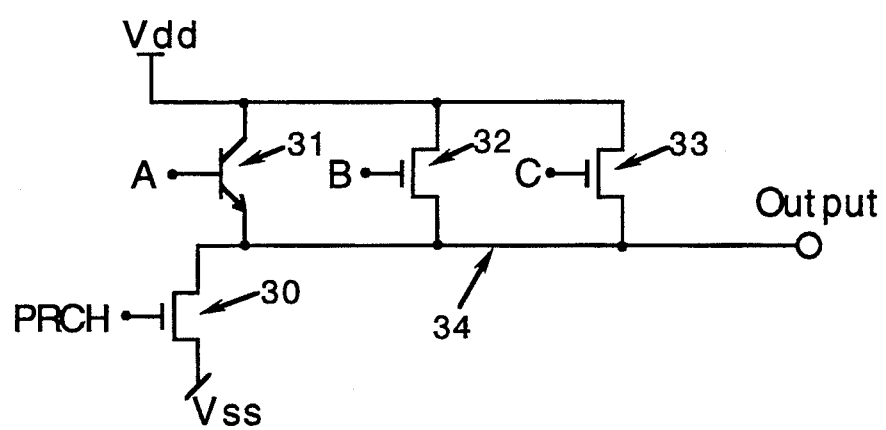
FIG. 2 is an example of a prior art dynamic OR circuit.
Figure 3:
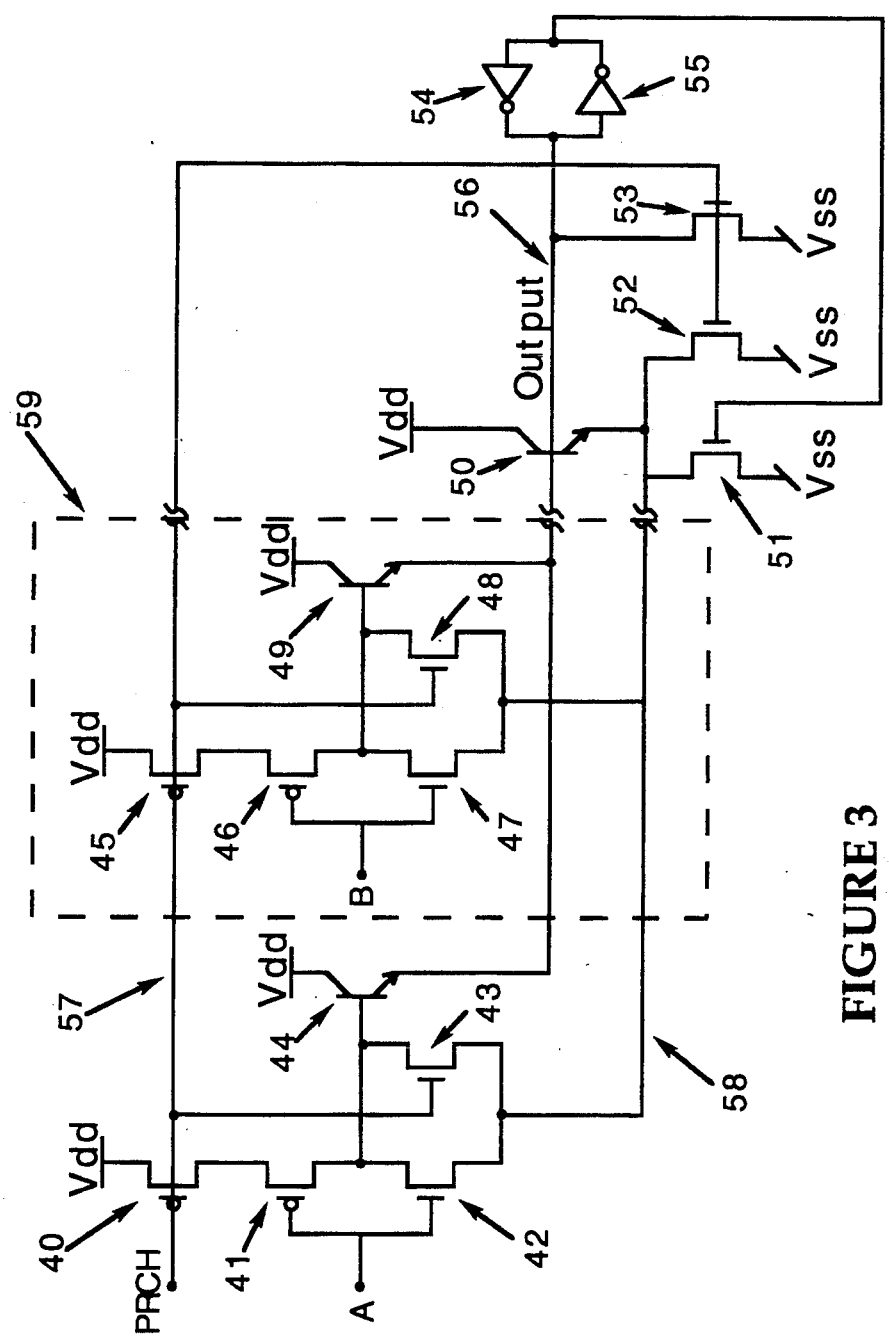

Since p-channel transistors 41 and 46, and bipolar transistors 44 and 49 are off, supply voltage Vdd remains isolated from the low voltage output line 56. If the output line 56 were to be entirely floating, as does the output line 34 in FIG. 2 when transistor 30 is off, small current leakage through the transistors between supply voltage Vdd and the output line 56 would cause the output line 56 to slowly float up to Vdd over time. To prevent this from happening, the small amount of current which leaks through the transistors to output line 56 must be continually drained from output line 56. Inverters 54 and 55 are provided to serve this function.

Inverters 54 and 55 work together to serve two functions. First, the inverters are configured to continually drain the output line 56 of charge thereby reinforcing the low voltage on the output line while the circuit is in its wait state after reset and before being triggered. Second, the inverters are configured to place a high voltage on the gate of transistor 51 thereby grounding the drain/feedback line 58 which in turn, through transistors 42 and 47, places a low voltage on the bases of bipolar transistors 44 and 49, respectively, in order to maintain the isolation of Vdd from the output line 56 through bipolar transistors 44 and 49.

The inverters 54 and 55 only need to be strong enough to drain the very small leakage current on output line 56 during its wait state, therefore, the transistors which comprise the inverters 54 and 55 need only be small dimension, relatively weak transistors. These weak transistors, because of their minimal dimensions, do not contribute parasitic capacitance to the output line 56 in any appreciable manner. Likewise, transistor 51 need only be strong enough to keep the base node of bipolar transistors 44 and 49 drained of charge leaking to it from supply voltage Vdd. Therefore, transistor 51 may also be a small dimension, weak transistor. So ultimately, the only parasitic capacitance of any appreciable nature which appears on the output line 56 of this circuit is MOS transistor 53 which needs to be relatively large in order to quickly drain the charge from output line 56 while the circuit is in its precharge or reset mode. Each additional input to this circuit contributes only the capacitance of one emitter (emitter capacitance) to the output line 56 as exemplified by bipolar transistors 44 and 49 for inputs A and B respectively. While these bipolar transistors may minimally contribute to the capacitive load on output line 56, the current driving capabilities of these bipolar transistors is high enough to overcome even large capacitive loads.

Since the output line 56 remains low during this wait state, the base of bipolar transistor 50, which is coupled to the output line 56, remains low thereby isolating supply voltage Vdd from drain/feedback line 58. Transistors 52 and 53, which serve to drain the charge from drain/feedback line 58 and output line 56, respectively, during precharge, are now off since their gate is coupled to the low PRCH node through line 57.

Now let us assume the circuit of FIG. 3 is triggered when input node A goes low. This will turn off transistor 42 and will turn on transistor 41 allowing supply voltage Vdd to reach the base of bipolar transistor 44. Bipolar transistor 44 will turn on pulling the output line 56 high. The inverter 55, whose output is coupled to the gate of transistor 51, will place a low voltage on the gate of transistor 51 turning it off thereby isolating the drain/feedback line 58 from Vss. The base of bipolar transistor 50, which is coupled to the high output line 56, will turn on transistor 50 which in turn will pull drain/feedback line 58 high. The high voltage on feedback line 58 will pass through transistor 47 thereby pulling the base of bipolar transistor 49 high even though the input node B to subcircuit block 59 is still high.

What has happened here is that when the output line was pulled high by turning on bipolar transistor 44, a portion of the voltage on the output line was fed back through a feedback loop consisting of output line 56 turning on bipolar transistor 50, which pulled up drain/feedback line 58 to a high voltage, which passed through transistor 47 to the base of bipolar transistor 49. The result is that the voltage at the base of bipolar transistor 49 has been raised to be approximately equal to the voltage at the emitter of bipolar transistor 49. Thus, the reverse bias voltage present across the base-emitter junction of bipolar transistor 49, which occurred when the output line 56 went high while the base of bipolar transistor 49 was still low, has been significantly reduced. Note that the base voltage of bipolar transistor 49 need not exactly match the emitter voltage of transistor 49 in order to significantly reduce the reverse bias voltage across the base-emitter junction of transistor 49. For instance, in the present example, the voltage at the base of bipolar transistor 49 will actually be slightly less than the voltage at the emitter of transistor 49 due to the voltage drop through bipolar transistor 50 within the feedback loop. The base voltage of a bipolar transistor need only approach the emitter voltage of a bipolar transistor. If the base voltage exceeds the emitter voltage of such a bipolar transistor, the reverse bias voltage may be considered to be eliminated. However, raising the base voltage to a level which may actually be quite a bit lower than the emitter voltage can still significantly reduce the reverse bias voltage present across the base-emitter junction of such a transistor.

In alternate embodiments of the present invention, the feedback loop circuitry which raises the voltage at the base of a bipolar transistor may include controlling one or more gates of MOS transistors which in turn control a supply voltage to the base of the bipolar transistor whose emitter is coupled to the output line. In other embodiments of the present invention, the base of bipolar transistors, whose emitters are coupled to a line which will go high while the base is low, may be pulled high before the emitter is pulled high in which case the feedback loop may actually be considered a feed-ahead loop. In still alternate embodiments of the present invention, the base of the bipolar transistor whose emitter is pulled high while the base is still low may be pulled to any level high enough such that the harmful effects of reverse bias base-emitter junction stress is significantly reduced, and need not be high enough such that the base is considered to have switched logical states.

After being triggered, the circuit of FIG. 3 will again need to be reset. To do this, the PRCH node goes high which will disengage the supply voltage Vdd through transistors 40 and 45 to inverter subcircuits of inputs A and B respectively. Transistors 52 and 53 will be turned on to drain any charge present on drain/feedback line 58 and output line 56 respectively. Transistors 43 and 48 will be turned on serving to drain any charge present at the base of transistors 44 and 49, respectively, to drain/feedback line 58 and through transistor 51 to Vss. Note that the sources of MOS transistors 43 and 48 may be connected directly to the output line 56 in order to drain the base charge of bipolar transistors 44 and 49, respectively, to output line 56 and through transistor 53 to Vss. However, such a connection would contribute to the capacitive load on the output line 56, thereby slowing the speed of the circuit. Such a scheme has other significant disadvantages which are overcome.

To demonstrate, let us consider the source of transistor 43 which is isolated from the emitter of bipolar transistor 44 by the base-emitter junction of bipolar transistor 50 as shown in FIG. 3. A threshold voltage is the voltage above which an MOS transistor is considered to be "on" and is defined in terms of the gate to source voltage, Vgs, of the MOS transistor. Whatever voltage is present at the drain of transistor 43 will experience a voltage drop Vbe across the base-emitter junction of transistor 44 and another voltage drop Vbe across the base-emitter junction of transistor 50 before reaching the source of transistor 43. If the base of transistor 44 has been fully charged to approximately Vdd after the circuit has been triggered, then initially, upon reset, the gate voltage of transistor 44 will be approximately Vdd while the source voltage of transistor 43 will be approximately Vdd minus Vbe of transistor 44 minus Vbe of transistor 50. These voltage drops ensure that Vgs is large enough such that the threshold voltage is always reached immediately upon reset whenever Vdd is present on the base of transistor 44.

If the source of transistor 43 is instead connected directly to the output line 56, then only a single voltage drop Vbe across the base-emitter junction of transistor 44 would separate the source of transistor 43 from the drain of transistor 43. This, in effect, would short the base-emitter junction of transistor 44 when transistor 43 is turned on. If this single voltage drop Vbe across the base-emitter junction of transistor 44 is not greater than the threshold voltage Vgs of transistor 43, then upon reset, if the voltage Vdd is present on the base of transistor 44, transistor 43 will not be able to drain it. Under these conditions, bipolar transistor 44 will remain on until the charge on its base is drained. This will cause a large current to be driven onto the output line 56 and through transistor 53 to Vss. Besides this large consumption of power, the amount of time it would take to then precharge the circuit would be unacceptably long. If multiple input nodes to the NAND gate of FIG. 3 go low thereby applying the supply voltage Vdd to the bases of several respective bipolar output transistors, the effect is even more dramatic.

FIG. 4 shows an alternate embodiment of the present invention implemented as a BiCMOS dynamic OR gate. In a currently preferred embodiment, transistors 71 and 75 are p-channel MOS transistors, transistors 73, 77, and 78 are npn bipolar transistors, and the rest are n-channel MOS transistors. 70 and 74 represent NAND gates while 81, 82, and 83 represent inverters. The gates of transistors 88 and 79 are coupled to the output of the inverter 83 while the input to inverter 83 is the PRCH node. One input to the NAND gates 70 and 74 are coupled to input nodes A and B, respectively, while their other inputs are coupled to the PRCH node. The gates of transistors 71 and 72 are coupled to the output of NAND gate 70 in the same manner that the gates of transistors 75 and 76 are coupled to the output of NAND gate 74. The transistors 71 and 72 are connected in series between Vdd and the output line 86 in the same manner that the transistors 75 and 76 are connected in series between Vdd and the output line 86. The base of bipolar transistor 73 is coupled to the drain of transistor 72 in the same manner that the base of bipolar transistor 77 is coupled to the drain of transistor 76 while the sources of transistors 72 and 76 are coupled to the drain/feedback line 58.

The collectors of transistors 73 and 77 are coupled to Vdd and the emitters of these transistors are coupled to the output line 86 which is in turn coupled to the base of transistor 78. The collector of transistor 78 is coupled to Vdd and its emitter is coupled to the drain/feedback line 85. The drain/feedback line 58 is separated from Vss by weak transistor 80 and transistor 79 in parallel. Transistor 88 separates the output line 56 from Vss.

Note that the subcircuit block 87 acts on input node B in the same manner in which an identical subcircuit block acts on input node A. In fact, any number of such subcircuit blocks identical to subcircuit block 87 may be connected in parallel in such a manner to precharge line 84, output line 86 and drain/feedback line 85. Because only a single bipolar transistor is coupled to the output line 86 for each additional subcircuit block input to the dynamic OR gate, this circuit is capable of supporting large fan-in applications. Also, additional inputs do not add any additional series MOS transistors to the circuit of FIG. 4, so the switching speed of this circuit is not significantly hindered by additional inputs in this respect.

For demonstrative purposes, however, we will assume that the dynamic OR gate of FIG. 4 is merely a two input OR gate. It should be realized, though, that the operation of each transistor within each additional subcircuit block identical to subcircuit block 87 will operate substantially the same as the respective transistor depicted in FIG. 4 and described below. In alternate embodiments of the present invention, the subcircuit blocks and, perhaps, general layout of the circuit in FIG. 4 may be adjusted to implement another form of an OR gate. In still alternate embodiments of the present invention, other logic functions may be implemented thereby also changing the specific circuit layout from the one depicted in FIG. 4.

Opposing inverters 81 and 82 are composed of small dimension MOS transistors configured to invert the signal present at their inputs. Inverter 81 has the gate of transistor 80 coupled to its input and output line 86 coupled to its output. Inverter 82, on the other hand, has output line 86 coupled to its input while the gate of transistor 80 is coupled to its output. If output line 86 is low, inverter 82, whose input is output line 86, will drive the gate of small dimension MOS transistor 80 high. At the same time, inverter 81, whose input is the gate of small dimension transistor 80, will pull the output line 86 low. In this manner, the inverters 81 and 82 work together to reinforce the voltage present on output line 86 and to control the operation of transistor 80.

The circuit of FIG. 4 is precharged by applying a low voltage at the PRCH node which will cause precharge line 84 to go low along with the respectively coupled inputs to NAND gates 70 and 74. The inverter 83 will cause a high voltage to appear on the gates of transistors 79 and 88 which are coupled to the output of inverter 83. This will drain any charge from the drain/feedback line 85 and output line 86. Transistors 72 and 76 will be on, draining charge from the base of bipolar transistors 73 and 77 respectively. Note that the transistors 72 and 76 do not short the base emitter junctions of transistors 73 and 77 thereby preventing the potential for a power surge and improving reset times as described above. After all the charge has been drained, the input nodes A and B to NAND gate 70 and 74, respectively, go low while the PRCH node goes high.

Inverters 81 and 82 perform the same function on output line 86 as inverters 54 and 55 perform on output line 56 in FIG. 3 as described above. Transistor 80 performs the same function in the circuit of FIG. 4 as transistor 51 performs for the circuit of FIG. 3 as described above. Assuming input B goes high, its respective bipolar transistor 77 will turn on thereby driving the output line 86 high. This will turn on bipolar transistor 78 which will pull up drain/feedback line 85. The high voltage on line 85 will be fed back through transistor 72 to the base of transistor 73 to raise the base voltage of transistor 73 thereby significantly reducing the reverse bias voltage present across the base-emitter junction of bipolar transistor 73. Note that in this circuit, the subcircuit block 87 of FIG. 4 may be duplicated and connected to the basic circuit structure many times while contributing only emitter capacitance to the output line 86. Since the amount of large MOS transistors appearing on the output line 86 has been minimized to one, transistor 88, the speed, fan-in and current driving capabilities of this OR gate are greatly improved. In a preferred embodiment of the present invention, a circuit of the type described herein may be used in a processor in conjunction with a computer system. Referring to FIG. 5, the computer system upon which a preferred embodiment of the present invention can be implemented is shown as 100. Computer system 100 comprises a bus or other communication means 101 for communicating information, and a processing means 109 coupled with bus 101 for processing information. System 100 further comprises a random access memory (RAM) or other dynamic storage device 104 (referred to as main memory), coupled to bus 101 for storing information and instructions to be executed by processor 109. Main memory 104 also may be used for storing temporary variables or other intermediate information during execution of instructions by processor 109. Computer system 100 also comprises a read only memory (ROM) and/or other static storage device 106 coupled to bus 101 for storing static information and instructions for processor 109. Data storage device 107 is coupled to bus 101 for storing information and instructions.

A data storage device 107 such as a magnetic disk or optical disk and its corresponding disk drive can be coupled to computer system 100. Computer system 100 can also be coupled via bus 101 to a display device 121, such as a cathode ray tube (CRT), for displaying information to a computer user. An alphanumeric input device 122, including alphanumeric and other keys, is typically coupled to bus 101 for communicating information and command selections to processor 109. Another type of user input device is cursor control 123, such as a mouse, a trackball, or cursor direction keys for communicating direction information and command selections to processor 109 and for controlling cursor movement on display 121. This input device typically has two degrees of freedom in two axes, a first axis (e.g., x) and a second axis (e.g., y), which allows the device to specify positions in a plane.

Another device which may be coupled to bus 101 is a hard copy device 124 which may be used for printing instructions, data, or other information on a medium such as paper, film, or similar types of media. Additionally, computer system 100 can be coupled to a device for sound or video recording and/or playback 125 such as an audio or video digitizer coupled to a microphone or camera for recording information. Further, the device may include a speaker which is coupled to a digital to analog (D/A) converter for playing back digitized sounds. Finally, computer system 100 can be a terminal in a computer network (e.g., a LAN).

In preferred embodiments of the present invention, a circuit of the type described herein may be used in a processor in conjunction with cache memories to determine if a probe tag differs from a stored tag. It may also be applied to zero or equality detect circuits in a datapath. Finally, it may be used for any application to execute any logic function.

A BiCMOS circuit has been described which exhibits the properties of large fan-in capability, ability to drive large capacitive loads, improved speed performance and enhanced reliability. Specific implementations of such a circuit have been described with respect to dynamic NAND gate and dynamic OR gate applications.

We claim:

1. A BiCMOS circuit which operates as a dynamic logic gate, said circuit having an input and an output, said circuit comprising:
   a first bipolar transistor having a base coupled to said input, an emitter coupled to said output, and a base-emitter junction;
   protection circuitry for raising a base voltage appearing at said base of said first bipolar transistor from a low base voltage to a higher base voltage when an emitter voltage appearing at said emitter of said first bipolar transistor switches from a low emitter voltage to a high emitter voltage thereby reducing or eliminating a reverse bias voltage appearing across said base-emitter junction; and a discharge transistor through which said base of said first bipolar transistor may be drained of charge in order to reset said BiCMOS circuit, said discharge transistor having a first and second end through which charge is drained, said first end of said discharge transistor being coupled to said base of said first bipolar transistor, said second end of said discharge transistor being coupled to a node, said node being separated from said emitter of said first bipolar transistor such that a voltage at said node is initially lower than a voltage at said emitter upon reset of said BiCMOS circuit.

2. The BiCMOS circuit of claim 1 wherein said BiCMOS circuit comprises a plurality of inputs, each of said inputs being coupled to a bipolar transistor which is operated in substantially the same manner as said first bipolar transistor such that each of said inputs contributes only emitter capacitance to said output thereby enabling said BiCMOS circuit to have large fan-in capacity while maintaining its ability to drive large capacitive loads.

3. The BiCMOS circuit of claim 1 wherein said protection circuitry comprises a feedback loop, said feedback loop feeding at least a portion of said emitter voltage back to said base of said first bipolar transistor to raise said base voltage from said low base voltage to said higher base voltage when said emitter voltage switches from said low emitter voltage to said high emitter voltage.

4. The BiCMOS circuit of claim 2 wherein said protection circuitry comprises a feedback loop, said feedback loop feeding at least a portion of said emitter voltage back to said base of said first bipolar transistor to raise said base voltage from said low base voltage to said higher base voltage when said emitter voltage switches from said low emitter voltage to said high emitter voltage.

5. The BiCMOS circuit of claim 4 wherein said BiCMOS circuit is used to determine if a probe tag differs from a stored tag in a cache memory.

6. The BiCMOS circuit of claim 1 wherein said discharge transistor is an n-channel MOS device, said first end of said discharge transistor is the drain of said MOS device, said second end of said discharge transistor is the source of said MOS device, and said node coupled to said second end of said discharge transistor is separated from said emitter of said first bipolar transistor by a base-emitter junction of a second bipolar transistor.

7. The BiCMOS circuit of claim 4 wherein said base of said first bipolar transistor is pulled high by switching a single MOS transistor.

8. A computer system comprising:
a main memory means for storage of information;
a processor means for manipulation of said information;
a bus means for transferring said information between said main memory means and said processor means;
said processor means including a bipolar transistor having a base coupled to an input, an emitter coupled to an output, and a base-emitter junction;
said processor means additionally including a protection means for raising a base voltage appearing at said base of said bipolar transistor from a low base voltage to a higher base voltage when an emitter voltage appearing at said emitter of said bipolar transistor switches from a low emitter voltage to a high emitter voltage thereby reducing or eliminating a reverse bias voltage appearing across said base-emitter junction.

9. The computer system of claim 8 wherein a BiCMOS circuit means having a plurality of inputs comprises said bipolar transistor, each of said plurality of inputs contributing only emitter capacitance to said output such that said BiCMOS circuit means has large fan-in capacity while maintaining its ability to drive large capacitive loads.

10. The computer system of claim 9 wherein a plurality of bipolar transistors are coupled to said output and operate substantially the same as said bipolar transistor.

11. The computer system of claim 8 wherein said bipolar transistor operates within a dynamic circuit means, said dynamic circuit means comprising a discharge means for draining a charge from said base of said bipolar transistor in order to reset said dynamic circuit means, said discharge means having a first and second end through which charge is drained, said first end of said discharge means being coupled to said base of said bipolar transistor, said second end of said discharge means being coupled to a node, said node being separated from said emitter of said bipolar transistor such that a voltage at said node is initially lower than a voltage at said emitter upon reset of said dynamic circuit means.

12. The computer system of claim 10 wherein said bipolar transistor operates within a dynamic circuit means, said dynamic circuit means comprising a discharge means for draining a charge from said base of said bipolar transistor in order to reset said dynamic circuit means, said discharge means having a first and second end through which charge is drained, said first end of said discharge means being coupled to said base of said bipolar transistor, said second end of said discharge means being coupled to a node, said node being separated from said emitter of said bipolar transistor such that a voltage at said node is initially lower than a voltage at said emitter upon reset of said dynamic circuit means.

13. The computer system of claim 8 wherein said protection means comprises a feedback means for feeding at least a portion of said emitter voltage back to said base of said bipolar transistor to raise said base voltage from said low base voltage to said higher base voltage when said emitter voltage switches from said low emitter voltage to said high emitter voltage.

14. The computer system of claim 12 wherein said protection means comprises a feedback means for feeding at least a portion of said emitter voltage back to said base of said bipolar transistor to raise said base voltage from said low base voltage to said higher base voltage when said emitter voltage switches from said low emitter voltage to said high emitter voltage.

15. The computer system of claim 14 wherein said dynamic circuit means is used to determine if a probe tag means differs from a stored tag means in a register means.

16. The computer system of claim 11 wherein said discharge means is an MOS transistor and said node coupled to said second end of said discharge means is separated from said emitter of said bipolar transistor by a base-emitter junction of a second bipolar transistor.

17. The computer system of claim 14 wherein said base of said bipolar transistor is pulled high by switching a single MOS transistor.

18. A method of improving the reliability of a BiCMOS circuit which operates as a dynamic logic gate, said circuit having an input and an output, said method comprising the step of providing protection circuitry to raise a low base voltage appearing at a base of a first bipolar transistor contained within said BiCMOS circuit to a higher base voltage when a low emitter voltage appearing at an emitter of said first bipolar transistor switches to a high emitter voltage, said input being coupled to said base and said output being coupled to said emitter, wherein said BiCMOS circuit comprises a discharge transistor through which said base of said first bipolar transistor may be drained of charge in order to reset said BiCMOS circuit, said discharge transistor having a first and second end through which charge is drained, said first end of said discharge transistor being coupled to said base of said first bipolar transistor, said second end of said discharge transistor being coupled to a node, said node being separated from said emitter of said first bipolar transistor such that a voltage at said node is initially lower than a voltage at said emitter upon reset of said BiCMOS circuit.

19. The method of claim 18 wherein said BiCMOS circuit comprises a plurality of inputs, each of said inputs being coupled to a bipolar transistor which is operated in substantially the same manner as said first bipolar transistor such that each of said inputs contributes only emitter capacitance to said output thereby enabling said BiCMOS circuit to have large fan-in capacity while maintaining its ability to drive large capacitive loads.

20. The method of claim 18 wherein said protection circuitry comprises a feedback loop, said feedback loop feeding at least a portion of said emitter voltage back to said base of said first bipolar transistor to raise said base voltage from said low base voltage to said higher base voltage when said emitter voltage switches from said low emitter voltage to said high emitter voltage.

21. The method of claim 19 wherein said protection circuitry comprises a feedback loop, said feedback loop feeding at least a portion of said emitter voltage back to said base of said first bipolar transistor to raise said base voltage from said low base voltage to said higher base voltage when said emitter voltage switches from said low emitter voltage to said high emitter voltage.

22. The method claim 21 wherein said BiCMOS circuit is used to determine if a probe tag differs from a stored tag in a cache memory.

23. The method of claim 19 wherein said discharge transistor is an MOS transistor and said node coupled to said second end of said discharge transistor is separated from said emitter of said first bipolar transistor by a base-emitter junction of a second bipolar transistor.

24. The method of claim 18 wherein said base of said first bipolar transistor is pulled high by switching a single MOS transistor.

* * * * *

UNITED STATES PATENT AND TRADEMARK OFFICE
CERTIFICATE OF CORRECTION

PATENT NO. : 5,399,918
DATED : March 21, 1995
INVENTOR(S) : Taylor, et. al.

Figure 1:
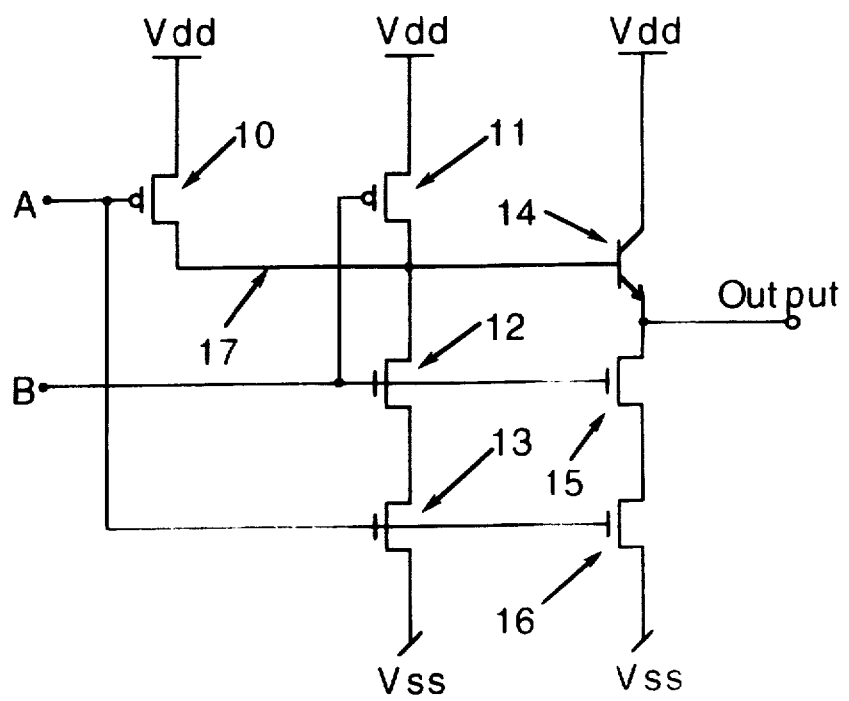
FIG. 1 is an example of a prior art NAND gate circuit.

It is certified that error appears in the above-identified patent and that said Letters Patent is hereby corrected as shown below:

Drawings:

Delete drawing sheet 1 of 5, and substitute therefor the drawing sheet, consisting of Fig. 1, as shown on the attached page.

Column 1, line 31, delete "lit fie" and subsitute --little--
Column 2, line 18, delete "prior an " and substitute --prior art--.
Column 16, line 18, insert --of-- between "method" and "claim".

Signed and Sealed this

Twenty-sixth Day of November 1996

Attest:

BRUCE LEHMAN

*Attesting Officer*   *Commissioner of Patents and Trademarks*